United States Patent [19]

Kelley, Jr.

[11] 4,143,315
[45] Mar. 6, 1979

[54] RMS TRANSDUCER AND VOLTAGE REGULATING SYSTEM EMPLOYING THE SAME

[75] Inventor: Fred W. Kelley, Jr., Media, Pa.

[73] Assignee: General Electric Company, Philadelphia, Pa.

[21] Appl. No.: 844,661

[22] Filed: Oct. 25, 1977

[51] Int. Cl.² .............................................. H02J 3/18
[52] U.S. Cl. .................................. 323/24; 307/252 Q; 323/102; 323/119; 323/127
[58] Field of Search .................. 328/26, 144; 307/261, 307/252 Q; 324/111, 107; 323/8, 22 SC, 24, 101, 102, 105, 106, 108, 109, 110, 119, 127, 128; 13/12, 24

[56] References Cited

U.S. PATENT DOCUMENTS

| | | | |
|---|---|---|---|
| 3,356,784 | 12/1967 | Bertioli et al. | 13/24 |
| 3,435,329 | 3/1969 | Hunter | 323/22 SC |
| 3,936,726 | 2/1976 | Kelley, Jr. | 323/109 |
| 3,936,727 | 2/1976 | Kelley et al. | 323/24 |
| 3,968,432 | 7/1976 | Kelley, Jr. | 324/107 |
| 3,983,494 | 9/1976 | Bose et al. | 328/21 |
| 4,028,614 | 6/1977 | Kelley, Jr. | 323/119 |
| 4,063,301 | 12/1977 | Lye | 323/119 |

Primary Examiner—Gerald Goldberg
Attorney, Agent, or Firm—William Freedman; Carl L. Silverman

[57] ABSTRACT

A voltage regulating system for an AC electrical power system includes a reactive converter having fixed capacitors and fixed inductors. Static switching devices are provided and include gating circuits for controlling the conduction angle of the switching devices so as to control the magnitude of the reactive current traversing the fixed inductors. RMS transducer circuitry is provided for generating an electrical signal representative of the RMS value of the voltage waveform at a critical point in the AC power system at which good voltage regulation is desired. Circuitry is provided for generating an electrical signal representative of a desired RMS value. Comparison components are provided for comparing these two electrical signals and generating an output signal for use in controlling the conduction angle of the switching devices so as to regulate the magnitude of the voltage waveform at the critical point in the AC power system. The RMS transducer circuitry employs a squaring function for generating a signal representative of the squared value of the voltage waveform. The RMS transducer circuitry also employs the positive and negative zero crossings of the waveform in combination with integrating components for operating on the squared value of the waveform for generating a signal representative of the squared RMS value of the waveform. Additional signal processing components provide an output signal therefrom which is representative of the RMS value of the voltage waveform over its last complete cycle. In one preferred embodiment, the value of the RMS over the last complete cycle of the voltage waveform is completely updated after each one half cycle. In this preferred embodiment, even and/or odd harmonics in the voltage waveform present no difficulties.

35 Claims, 8 Drawing Figures

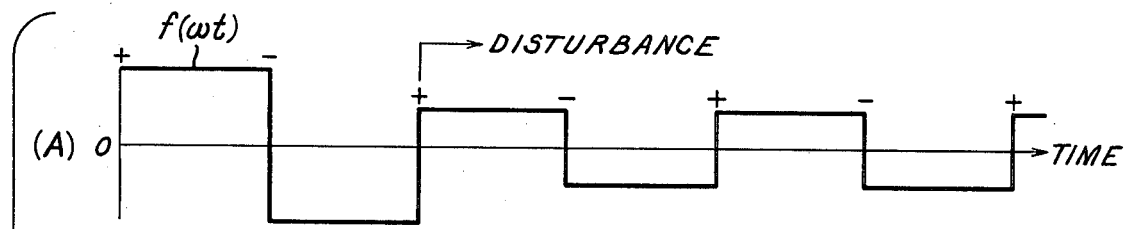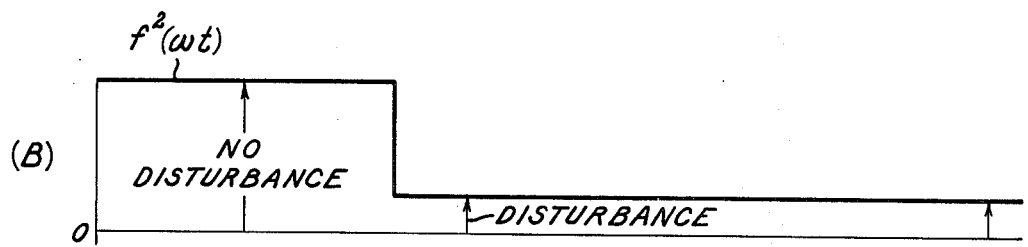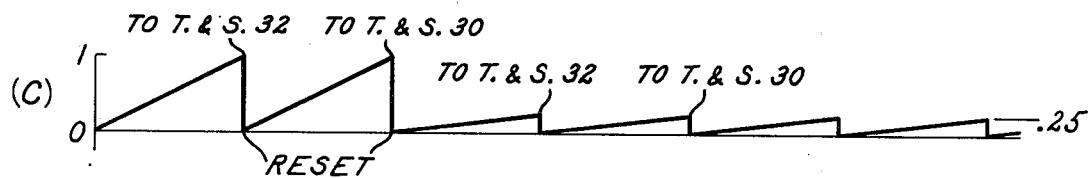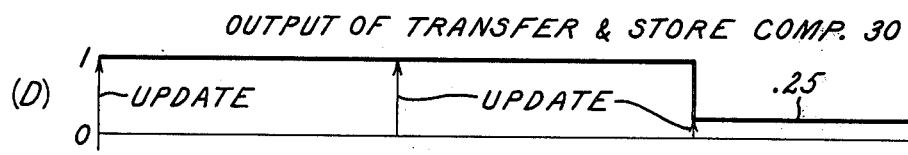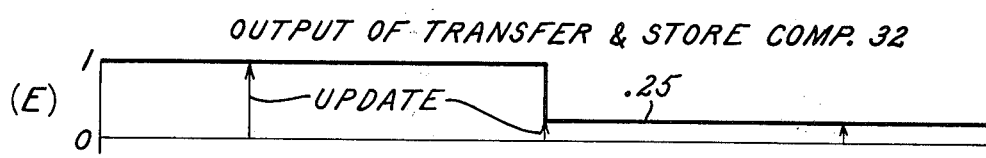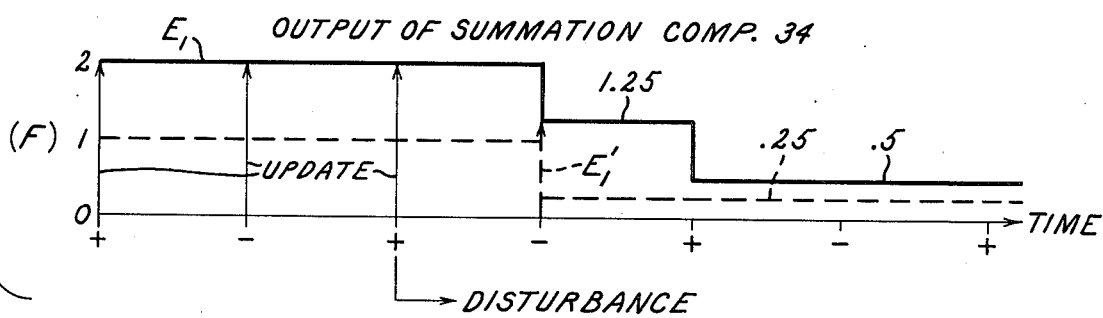
Fig. 2.

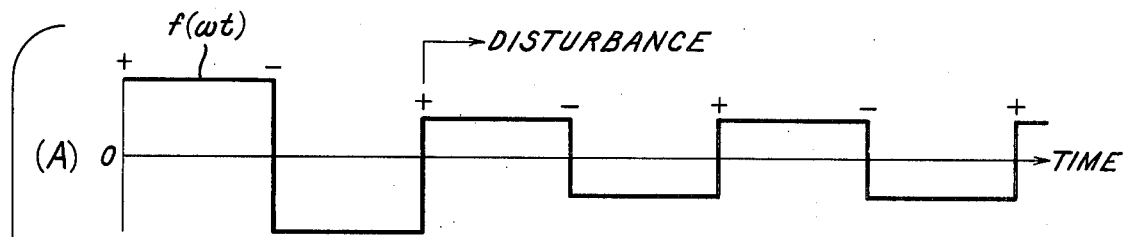
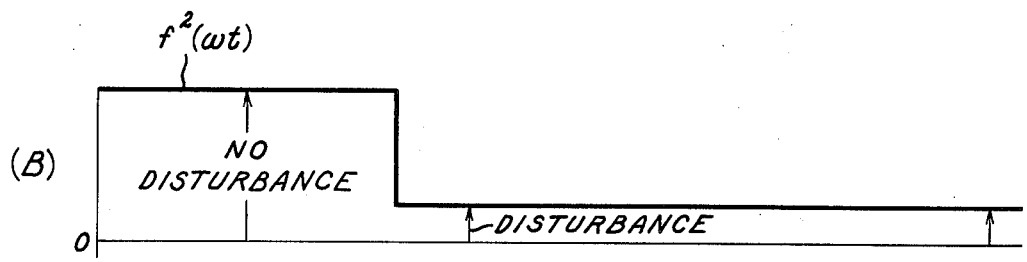
Fig. 6.
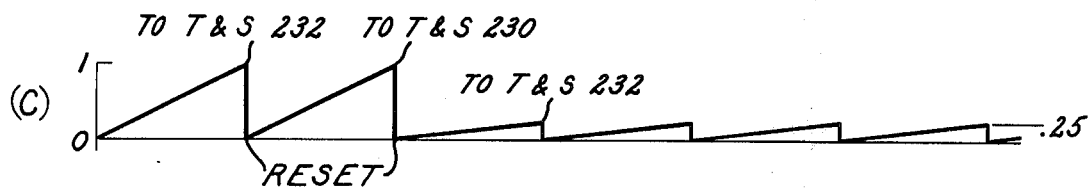
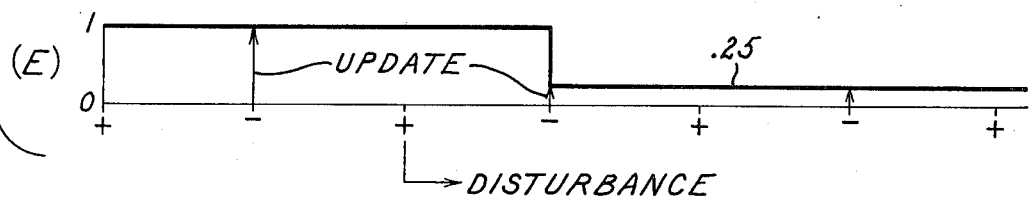

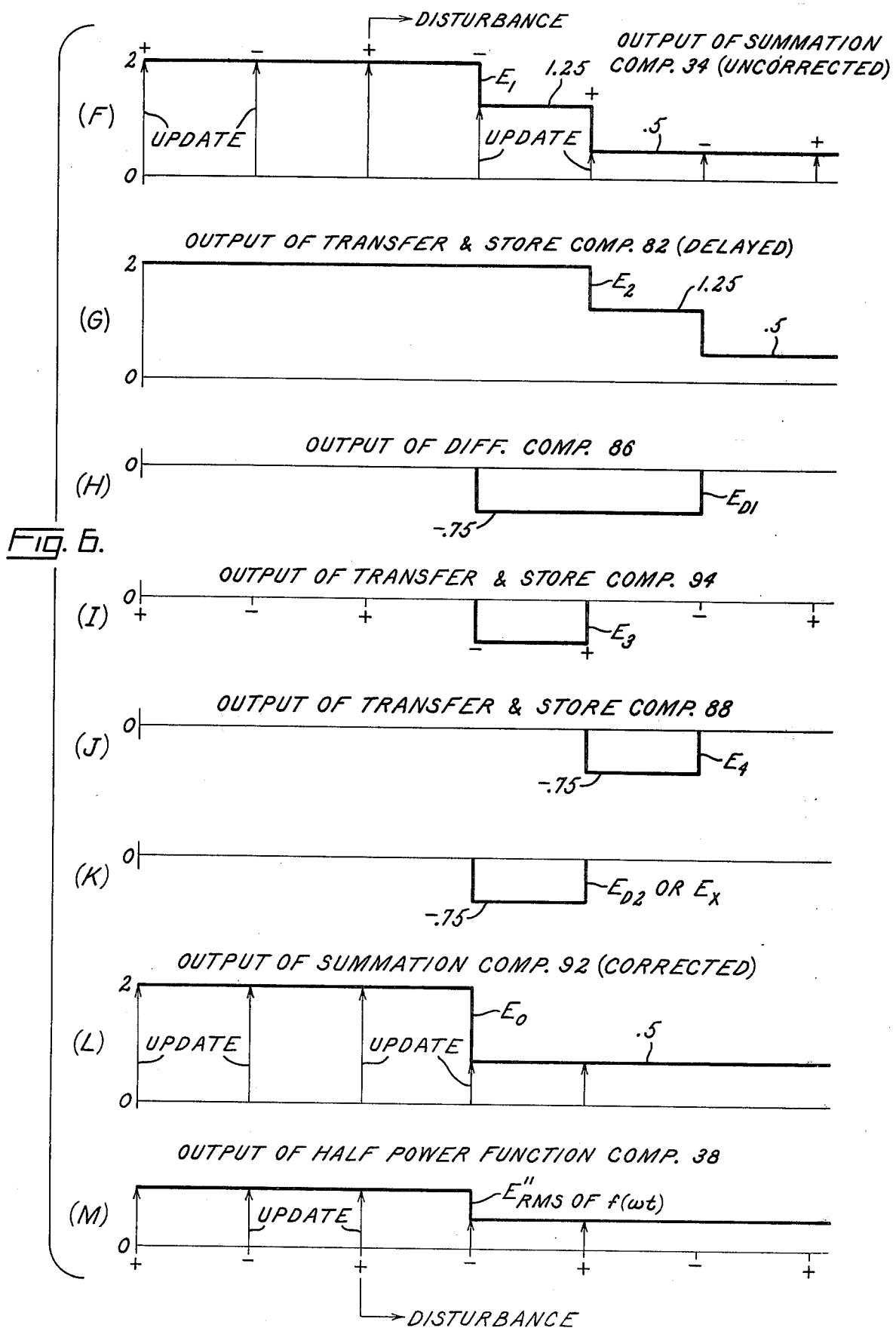

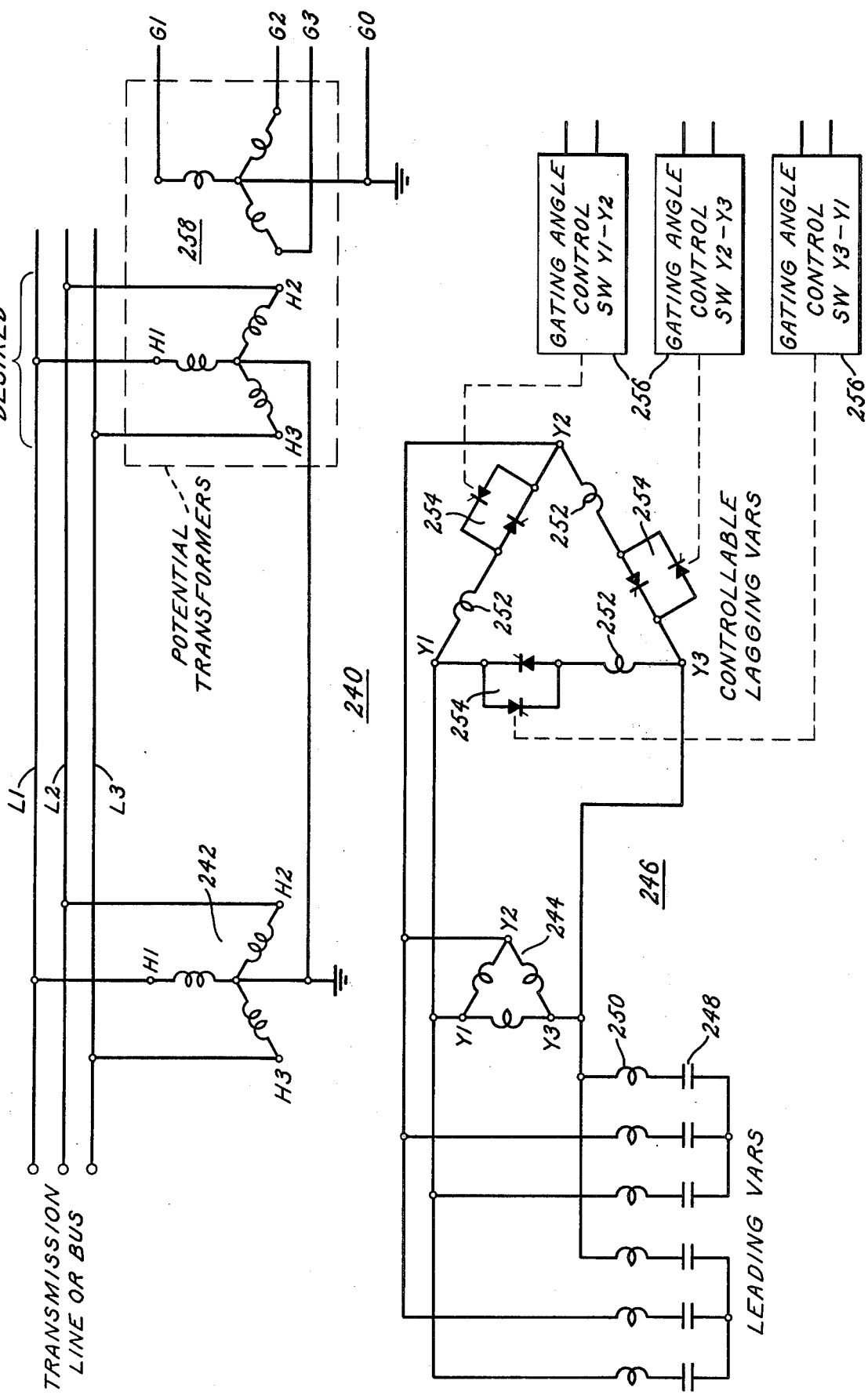

RMS TRANSDUCER AND VOLTAGE REGULATING SYSTEM EMPLOYING THE SAME

BACKGROUND OF THE INVENTION

This invention relates to a RMS transducer for use in a rapidly responsive voltage regulating system, and more particularly, to a voltage regulating system for an AC power system.

The term RMS, or root-mean-square, is widely employed in the electrical arts. In a time varying or alternating current (AC) waveform, the RMS is a value which may be used for an accurate computation of power. In many AC voltage regulating systems, the RMS voltage at a critical point in the AC power system in monitored. When the monitored RMS voltage at the critical point sufficiently departs from a prescribed value, means are activated for causing it to return to its prescribed value. Such means may include voltage regulating systems employing reactive compensation means such as that disclosed in U.S. Pat. Nos. 3,936,727 and 3,468,432, respectively issued to Kelley et al. and Kelly, on Feb. 3, 1976 and July 6, 1976. These patents are assigned to the assignee of the present invention and are hereby incorporated by reference in the present application.

The Kelley et al., Kelley system disclosed in the previously mentioned patents is suitable for use in industrial power systems serving an erratic reactive load, e.g., an arc furnace, as well as in electrical utility transmission systems for regulating voltage. In very brief terms, the Kelley et al., Kelley system provides input signals for rapid static switching of a reactive converter which can controllably supply compensating leading or lagging current or VARs. The reactive converter comprises fixed inductor means and fixed capacitor means. Static switching means are disposed in series circuit relation with the fixed inductor means. The static switching means includes gating means for controlling the conduction angle of the switching means. In the transmission system application, the RMS voltage at the critical point in the AC power system at which good voltage regulation is desired is compared with a desired RMS value. A sufficient difference therebetween produces an output signal which is utilized for adjusting the conduction angles of the inductor means of the reactive converter. More particularly, if the monitored RMS value at the critical point is sufficiently below the prescribed value, a signal is generated which causes the reactive converter to provide leading current or VARs into the system. This has the effect of raising the system RMS value of the voltage to the prescribed value. Conversely, if the monitored RMS voltage at the critical point is sufficiently above the prescribed value, a signal is generated which causes the reactive converter to provide lagging current (VARs) or less leading current (VARs) so as to have the effect of lowering the system RMS voltage value to the prescribed value.

In the previously described Kelley et al., Kelley system, the reactive converter rapidly responds to adjust leading and lagging current (VARs) each one half cycle. However, the responsiveness of a voltage regulating system employing such a reactive converter is limited by the time delay in monitoring the RMS voltage at the critical point in the power system at which good voltage regulation is desired. In this connection, known RMS transducer means are generally of three types: thermalmeters; diode arrangements employing logarithmic functions and filters; and operational amplifiers employing filters. These RMS transducers provide undesirable time delays in monitoring the RMS value so as to be generally undesirable in a voltage regulating system of the type employing the previously described Kelley et al., Kelley reactive converter.

Therefore, it is a general object of this invention to provide rapidly responsive means for determining the RMS value of a time varying waveform.

Another object of this invention is to provide transducer means which is updated each one half cycle.

Another object of this invention is to provide such transducer means which is substantially unaffected by harmonics.

Another object of this invention is to provide such transducer means which is substantially unaffected by both odd and even harmonics.

Another object of this invention is to provide a rapidly responsive voltage regulating system for an AC power system employing RMS voltage transducer means.

Another object of this invention is to provide such a voltage regulating system in which the transducer means is capable of determining the RMS value of the last cycle in the voltage waveform.

SUMMARY OF THE INVENTION

In carrying out one form of the present invention, I provide apparatus for generating an electrical signal representative of the RMS value of a time varying waveform of the form $f(\omega t)$. The apparatus includes first signal processing means for generating a first electrical output signal representative of the squared value of the time varying waveform. Second signal processing means are provided for generating a second electrical signal at zero crossings of the time varying waveform. Third signal processing means are provided for integrating the electrical signal generated by this first signal processing means over time periods defined by the second electrical signals representative of the zero crossings and generating a third output signal therefrom which is representative of the integrated value over one of the time periods. Reset means is provided for resetting the third output signal. The reset means is operable at zero crossings of the waveform for resetting the third signal processing means to start the third signal processing means on a new integrating operation. Fourth signal processing means are provided for receiving the third output signal and developing a substantially continuous fourth output signal representative of the value of the third output signal at the zero crossings of the waveform. The fourth signal processing means includes update means operable at zero crossings of the waveform for updating the fourth output signal. Fifth signal processing means are provided for receiving the fourth output signal of the fourth signal processing means and generating a fifth electrical signal representative of the square root thereof.

The apparatus of the above paragraph is suitable for use as transducer means in a voltage regulating system for an AC electrical power system. The voltage regulation system includes a reactive converter having fixed inductor and capacitor means. Static switching means are provided and include gating means for controlling the conduction angle of the switching means. Means are provided for supplying a reference signal representative of a desired voltage level. Means are provided for comparing this signal with the output signal of the transducer apparatus and then providing an output signal therefrom which is directed to the gating means of the static switching means so as to control the conduction angle of the switching means.

BRIEF DESCRIPTION OF THE DRAWINGS

My invention will be more fully understood and its several objects and advantages further appreciated by referring now to the following description taken in conjunction with the accompanying drawings wherein:

FIGS. 2A–2F depict a series of signal waveforms associated with the signal processing circuit of FIG. 1.

FIGS. 6A–6M depict a series of signal waveforms associated with the signal processing circuit of FIG. 5.

FIG. 7 is a highly simplified block diagram of a portion of one exemplary form of voltage regulating system for an AC power system of the present invention.

DETAILED DESCRIPTION OF THE INVENTION

Figure 1:
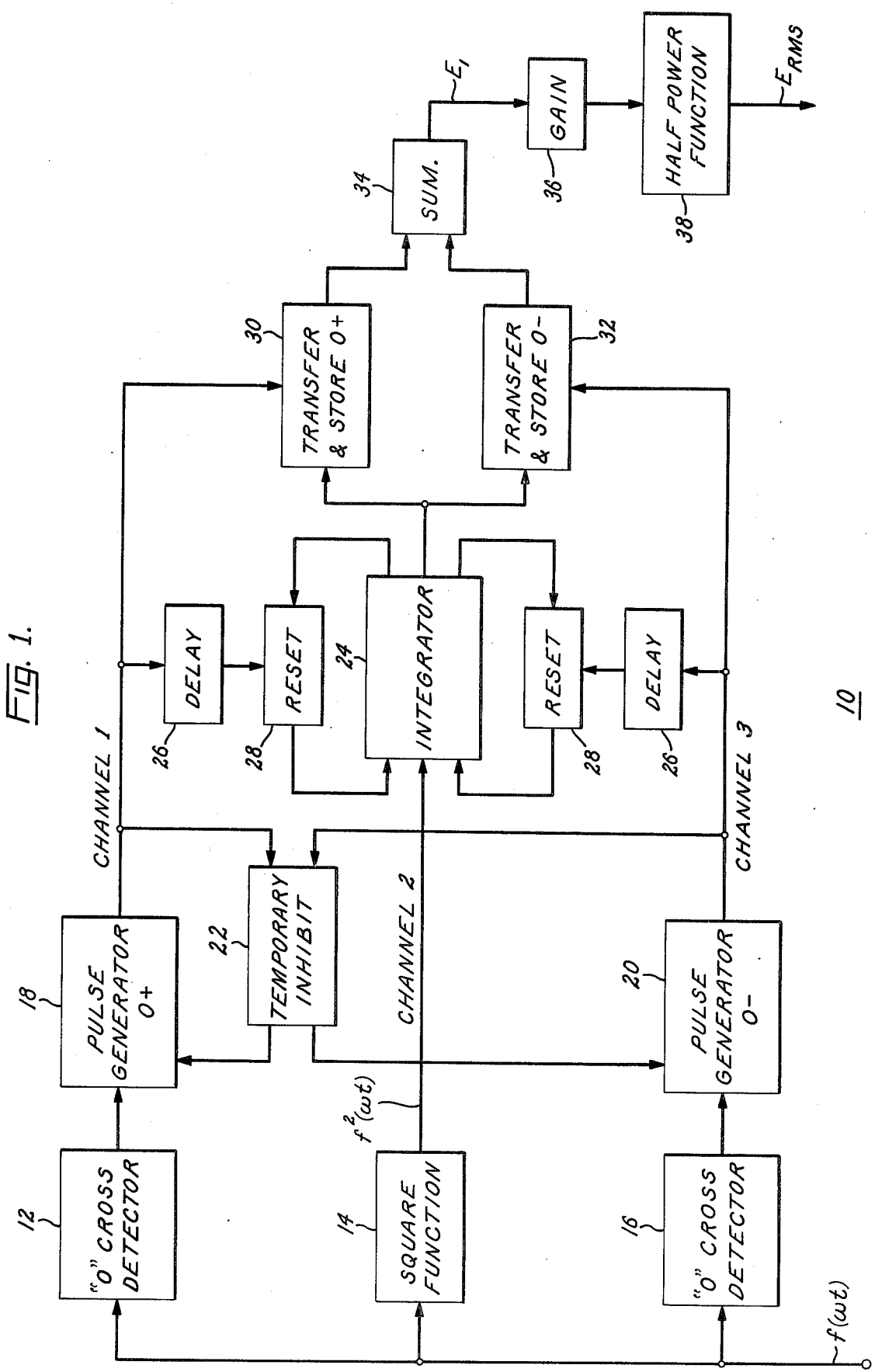
FIG. 1 is a block diagram of one exemplary form of signal processing circuit suitable for use in the present invention.

Referring initially to FIG. 1, an exemplary signal processing circuit suitable for use in one form of the present invention is generally designated 10. The waveform f ($\omega$t) whose RMS is to be monitored may, for purposes of illustration, represent a quantity associated with one phase of a three phase AC electrical power system. A signal representative of the voltage waveform f ($\omega$t) is applied to 3 channels. The representative signal may be simply obtained through the use of a potential transformer (not shown). For purposes of clarity, the representative signal will hereinafter be termed f ($\omega$t), it being understood that such signal is actually the stepped down value of the voltage waveform. Channel 1 includes a zero cross detector 12 for positive dV/dt which generates a signal when the f ($\omega$t) waveform crosses through zero from a negative polarity, i.e., $$\frac{d f(\omega t)}{dt} > 0.$$

Channel 2 includes a square function component 14 which generates an output signal representative of the square of the f ($\omega$t) waveform. The square function provided by component 14 is simply accomplished by inputting the f ($\omega$t) waveform signal into both input channels of a standard multiplying component. Channel 3 includes a zero cross detector 16 for negative dV/dt which generates a signal when the f ($\omega$t) waveform crosses through zero from a positive polarity, i.e., $$\frac{d f(\omega t)}{dt} < 0.$$

The output signals of the zero cross detectors 12 and 16 are respectively directed into pulse generators 18 and 20 which amplify the zero cross detector pulses. The pulse generators 18 and 20 are cross connected through temporary inhibit component 22. The output signal of the square function component 14 is directed into an integrator component 24. The output signals of the pulse generators 18 and 20 are respectively directed to the integrator component 24 through a delay component 26 and a reset component 28. The output signal of the integrator component 24 is directed to transfer and store components 30 and 32. (Note that, to those skilled in the art, the transfer and store components are also known as sample and hold components). Transfer and store component 30 receives an activating input from the pulse generator 18 while transfer and store component 32 receives an activating input from the pulse generator 20. Thus, transfer and store component 30 receives activating information relating to zero to positive crossings while transfer and store component 32 receives activating information relating to zero to negative crossings. For clarity of description, these zero crossings will hereinafter be respectively termed positive zero crossings and negative zero crossings. The output signals of transfer and store component 30 and 32 are directed to a summation component 34. The summation component 34 produces an output signal which is directed into a gain component 36. The output of the gain component 36 is directed into a half power function component 38. The half power function component 38 produces an output signal, hereinafter $E_{RMS}$, which is representative of the RMS of the f ($\omega$t) waveform over its last cycle.

The operation of the signal processing circuit 10 of FIG. 1 will now be discussed. The integrator component 24 of channel 2 integrates the squared value $f^2$ ($\omega$t) over time periods which are set by the activating inputs received from the zero crossing information processed and generated in channels 1 and 3. That is, channel 1 provides the integrator component 24 with the time instant associated with each positive zero crossing while channel 3 provides the integrator component 24 with the time instant associated with each negative zero crossing.

Referring now to channels 1 and 2, the zero cross detector 12 generates an electrical signal at each time instant associated with a positive zero crossing. This signal is amplified by the pulse generator 18 resulting in a signal of microseconds duration. The temporary inhibit means 22 is preferably provided at this point to minimize zero pulses due to harmonics. The amplified positive zero crossing signal activates the transfer and store component 30 to adjust its output to the value at the integrator output at this instant. At this instant, the value of the integrator output is (as will soon be better appreciated), the integrated value of $f^2$ ($\omega$t) over the time period between the subject positive zero crossing and the immediately preceding negative zero crossing of the f ($\omega$t) waveform. This integrated value is stored in the transfer and store component 30 and transferred as its output until the transfer and store component 30 is subsequently activated by the following positive zero crossing pulse of the f ($\omega$t) waveform. If the integrated value of the $f^2$ ($\omega$t) waveform at this subsequent instant is different from the previous instant, the new value is transferred and stored similarly until the next activation, i.e., the next positive zero crossing of the f ($\omega$t) waveform. If the value remains constant, the transfer and store component 30 will continue to transfer the constant value.

In order to ensure that the transfer and store component 30 has sufficient time to perform its storing function, the output signal of the positive zero crossing pulse generator 18 is preferably delayed by the delay component 26 and then directed to the reset component 28. The reset component 28 then produces a delayed signal which is directed to the integrator component 24 which then causes the then accumulated (and now stored) integrated value of $f^2$ ($\omega$t) at the time instant associated with the positive zero crossing to be erased, i.e., reset to zero. This causes the integrator component 24 to resume integrating the channel 2 squared function $f^2$ ($\omega$t). (It should be noted that the loss of the integrated value $f^2$ ($\omega$t) caused by the delay component 26 is so insubstantial that, for the purposes of the subject invention, its effect on the measured value of the RMS of the f ($\omega$t) waveform can be ignored).

The next transfer and store function and delayed resetting of the integrator 24 (after the above-described positive zero crossing) occurs in response to the following negative zero cross pulse generated in channel 3. More particularly, before resetting the integrator component 24 at the following negative zero crossing of the f ($\omega$t) waveform, the accumulated integrated value of $f^2$ ($\omega$t) over the time period between the above-described previous positive zero crossing and the present negative zero crossing is transferred and stored by the transfer and store component 32. As a result, substantially continuously between consecutive positive zero crossings of the f ($\omega$t) waveform, the transfer and store component 30 is transferring an electrical signal representative of the integrated value of the $f^2$ ($\omega$t) waveform over the time period between a first negative zero crossing and a second or following positive zero crossing of the f ($\omega$t) waveform. Similarly, substantially continuously between consecutive negative zero crossings of the f ($\omega$t) waveform, the transfer and store component 32 is transferring an electrical signal representative of the integrated value of the $f^2$ ($\omega$t) waveform over the time period between the positive zero crossing and a following negative zero crossing of the f ($\omega$t) waveform. The above function of the integrator component 24 and the transfer and store components 30 and 32 is repeated at subsequent zero crossings of the f ($\omega$t) waveform.

Thus, when the output signals of the transfer and store components 30 and 32 are summed at the summation component 34, the resulting output signal, hereinafter $E_1$, is representative of the integrated value of $f^2$ ($\omega$t) over the last cycle of the f ($\omega$t) waveform. That is, as hereinbefore discussed, the cycle is defined by the time period between a positive to negative to positive zero crossing of the f ($\omega$t) waveform (or any three consecutive zero crossings). The output signal $E_1$ is then directed through the gain component 36 which may, if desired, introduce the factor $f$, representing the frequency of the f ($\omega$t) waveform into the output signal $E_1$ from the summation component 34. The output signal from the gain component 36 is then directed into the half power function component 38, resulting in the signal output $E_{RMS}$ which is representative of the RMS value of the f ($\omega$t) waveform over its last cycle.

As briefly mentioned previously, the purpose of the temporary inhibit component 22 is to prevent the generation of false zero crossing pulses in the event that the f ($\omega$t) waveform includes more than two zero crossings per cycle of fundamental frequency. Such a situation may occur when the f ($\omega$t) waveform includes a high frequency oscillation in the region of the zero crossings. This would cause multiple zero crossings each half cycle of fundamental frequency. Under these conditions, the temporary inhibit component 22 allows the selection of the first of these multiple zero crossings while inhibiting the generation of pulses for the additional zero crossings.

It is important to note that the signal processing circuit 10 of FIG. 1 provides as its output signal, $E_{RMS}$, a representation of the RMS value of the last cycle of the waveform and includes information received during the last one half cycle between the last two zero crossings of the f ($\omega$t) waveform. As pointed out in the Background of the Invention, this type of rapid response is highly desirable for use as transducer means in voltage regulating systems, particularly those employing responsive reactive converters, of the Kelley et al., Kelley type.

The operation of the signal processing circuit 10 of FIG. 1 will now be further discussed and appreciated through inspection of FIG. 2A–2F which depict signal waveforms associated therewith. For clarity of description, the time varying waveform f ($\omega$t) has been shown as a rectangular waveform. In FIG. 2A, zero crossings of the f ($\omega$t) voltage waveform are simply designated positive (+) or negative (−). For the purposes of illustration, three complete cycles of the waveform are shown with a disturbance occurring after the first complete cycle. FIG. 2B shows the value of $f^2$ ($\omega$t). In FIG. 2C, the integrated value of $f^2$ ($\omega$t) at each zero crossing of f ($\omega$t) is shown. This corresponds to the output of the integrator component 24. Note that the delay in the integration of the $f^2$ ($\omega$t) signal associated with the resetting of the integrator component 24 after each zero crossing of the f ($\omega$t) waveform is not shown. The output signals of the transfer and store components 30 and 32 are respectively shown in FIGS. 2D and 2E. The output signal $E_1$ of the summation component 34 is shown in FIG. 2F.

Note that the effect of the disturbance shown in the second complete cycle of FIG. 2A is rapidly monitored by the signal processing circuit 10 of FIG. 1. This can be appreciated by referring to FIG. 2F where the updated value each half cycle, i.e., at each zero crossing of the f ($\omega$t) voltage waveform, provides an output signal $E_1$ whose value at any time instant is representative of the integrated value of the $f^2$ ($\omega$t) waveform over the immediately preceding two half cycles. Referring now to the numerical values which, for purposes of illustration, have been placed on various portions of FIGS. 2C–2F, it can be seen that as the zero crossing value of the integrated $f^2$ ($\omega$t) waveform shown in FIG. 2C changes from 1.0 units to 0.25 units as a result of the disturbance, the output signal $E_1$ of the summation component 24 drops from 2.0 units to 1.25 units after one half cycle of the disturbance and ultimately to the correct 0.5 unit value after one complete cycle of the disturbance, as shown in FIG. 2F. Thus, it is to be appreciated that the signal processing circuit 10 is at least partially updated after each half cycle, and completely updated after one complete cycle, as shown in FIG. 2F. The information shown in dashed lines in FIG. 2F will be discussed later in connection with another embodiment of this invention.

Figure 3:
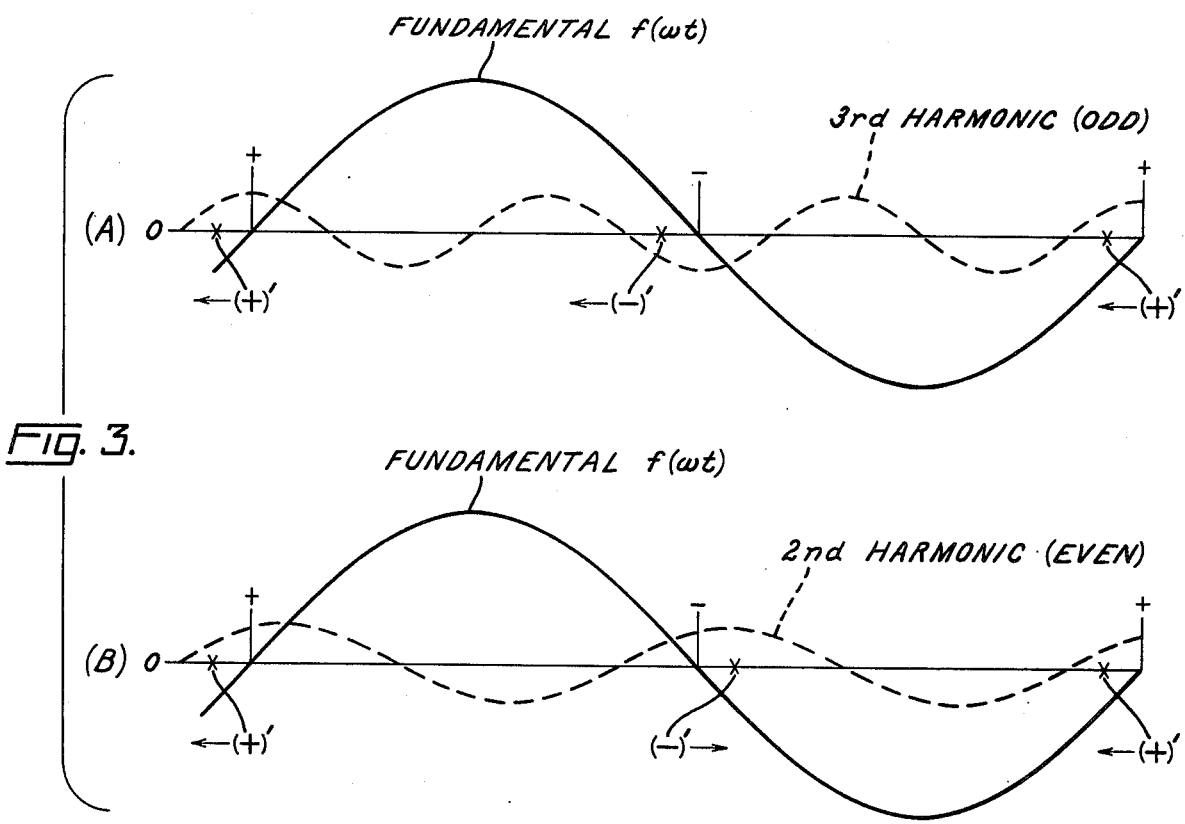
FIGS. 3A & 3B respectively depict the effect of odd and even harmonics on the zero crossings of a time varying waveform of the form f ($\omega$t).

The operation of the signal processing circuit 10 of FIG. 1 in the presence of harmonics of the f (ωt) voltage waveform will now be discussed. As the signal processing circuit 10 operates through zero crossing information, it is important to examine the effect of harmonics upon the positive and negative zero crossings of the f (ωt) waveform. Referring now to FIG. 3A and 3B, various fundamental waveforms and harmonics associated therewith are shown. FIG. 3A shows an odd harmonic in dashed lines, i.e., the third harmonic which leads the fundamental f (ωt) waveform by about 30°. As can be seen in FIG. 3A, the presence of the odd harmonic causes the positioning of the positive (+) and negative (−) zero crossings of the f (ωt) waveform to uniformly shift in the direction of the arrows to zero crossings hereinafter designated (+)' and (−)'. Since the shifting of zero crossings is uniform, the signal processing circuit 10 of FIG. 1 remains applicable to such situations.

Referring now to FIG. 3B, an even harmonic shown in dashed lines, i.e., the second harmonic which leads the fundamental f (ωt) waveform by about 30°, causes the zero crossings of the f (ωt) waveform to shift their position. More particularly, as shown in FIG. 3B, the negative zero crossing (−) of the f (ωt) waveform is shifted to the right in the direction of the arrow, resulting in the zero crossing (−)'. The preceding and following positive zero crossings (+) of the f (ωt) waveform are shifted to the left in the direction of the associated arrows. This means that the time duration between the positive to negative zero crossings of the f (ωt) waveform is not the same as the time duration between the negative zero crossing and the following positive zero crossing. That is, in the presence of an even harmonic, the half cycle between the positive to negative zero crossings of the f (ωt) waveform may not be equal in time duration to the following half cycle between the negative zero crossing and the following positive zero crossing of the f (ωt) waveform.

Referring again to the signal processing circuit 10 of FIG. 1, it can be observed that this unequality of half cycle between consecutive zero crossings in the presence of even harmonics is no problem. This is due to the fact that the circuit 10 includes the summation of the integrated values of $f^2$ (ωt) over consecutive half cycles determined by consecutive positive to negative to positive zero crossings of the f (ωt) waveform (or any three consecutive zero crossings). Thus, although the consecutive half cycles may be unequal in time duration in the presence of even harmonics, each positive and negative zero crossing is respectively shifted the same amount so that over the last complete cycle of positive to negative to positive zero crossing of the f (ωt) waveform (or any three consecutive zero crossings), the time duration is substantially equal to the period of the fundamental frequency component of f (ωt). In connection with harmonics, it is to be further appreciated that, the presence of even or odd harmonics at 0° or 180° with respect to the fundamental f (ωt) waveform have no effect upon the positioning of the zero crossings associated therewith. Thus, in view of the above, the signal processing circuit 10 of FIG. 1 is suitable for use when even and/or odd harmonics are present. It should also be noted that the temporary inhibit means 22 provides some protection against inadvertent zero pulses caused by harmonics.

Figure 4:
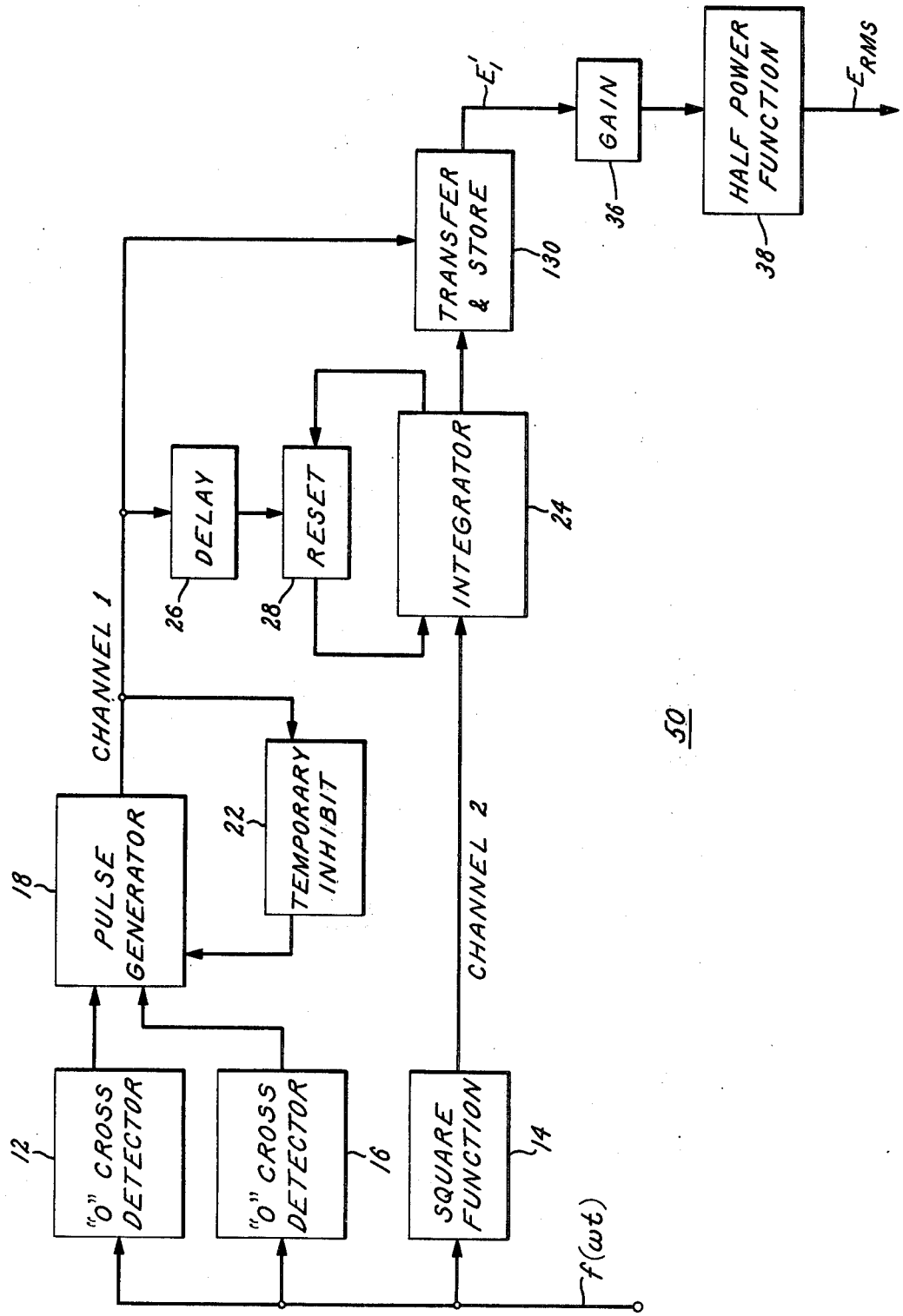
FIG. 4 is a block diagram of another exemplary form of signal processing circuit suitable for use in the present invention.

Referring now to FIG. 4, a second exemplary signal processing circuit suitable for use in one form of the present invention is generally designated 50. The signal processing circuit 50 of FIG. 4 is similar to the signal processing circuit 10 of FIG. 1 so that, where possible, like reference numerals are employed to represent like elements.

The signal processing circuit 50 of FIG. 4 employs two channels, as compared to the three channel processing circuit 10 of FIG. 1, and is most useful in applications where the f (ωt) waveform involves only a fundamental component of constant frequency and odd harmonic components. In the circuit 50, integration of the $f^2$ (ωt) waveform is provided between time periods defined by consecutive positive-negative-positive . . . zero crossings of the f (ωt) waveform thereby completely updating the integrated value of $f^2$ (ωt) transferred by the single transfer and store component 130 each one half cycle. It is understood that, as employed herein, the half cycle represents the time duration between positive to negative or negative to positive zero crossings of the f (ωt) waveform and, as such, the half cycles may not be equal.

The comparative operation of the signal processing circuit 50 of FIG. 4 in relation to the signal processing circuit 10 of FIG. 1 can be appreciated by referring again to FIGS. 2A–2F. More particularly, the dashed lines in FIG. 2F indicate the output signal $E_1$, of the transfer component 130 of the signal processing circuit 50 of FIG. 4 under the same disturbance conditions previously discussed. It can be observed that, after only one half cycle of the disturbance of 0.25 units, the signal processing circuit 10 of FIG. 1 produces an output signal $E_1$ representative of the sum of the values of the preceding two half cycles. That is, in the illustrative situation, the output signal $E_1$ represents the sum of a 0.25 unit value and a 1.0 unit value, or a total value of 1.25. This is to be contrasted with the signal processing circuit 50 of FIG. 4 which produces a more rapid response signal $E_1'$ of 0.25 units immediately following the disturbing half cycle.

However, although the signal processing circuit 50 of FIG. 4 is updated more rapidly than the signal processing circuit 10 of FIG. 1, and hence is more rapidly responsive to disturbances, it is to be appreciated that, in the presence of even harmonics, the time duration between successive half cycles may be unequal. Thus, in the case of unequal half cycles, even if the f (ωt) waveform has no disturbances, and hence, a constant RMS value, the signal processing circuit 50 will undesirably produce an output signal $E'_{RMS}$ that is greater than the true RMS value during one polarity of half cycles of f (ωt) and an output signal $E'_{RMS}$ which is less than the true RMS during the opposite polarity of half cycles of f (ωt). However, it is to be noted that, as discussed previously, the presence of even harmonics at zero degrees or 180° with respect to the fundamental f (ωt) waveform has no effect on the positioning of the zero crossings associated therewith and can thus be neglected. In order to ensure that the signal $E'_{RMS}$ of FIG. 4 is representative of the RMS, it is desirable to introduce a factor into the gain component 36 to project the half cycle information into a full cycle value. For example, instead of introducing the factor $f$ into the processed signal $E_1'$, as in the circuit 10 of FIG. 1, the factor 2 $f$ can be introduced, where $f$ represents frequency.

Figure 5:
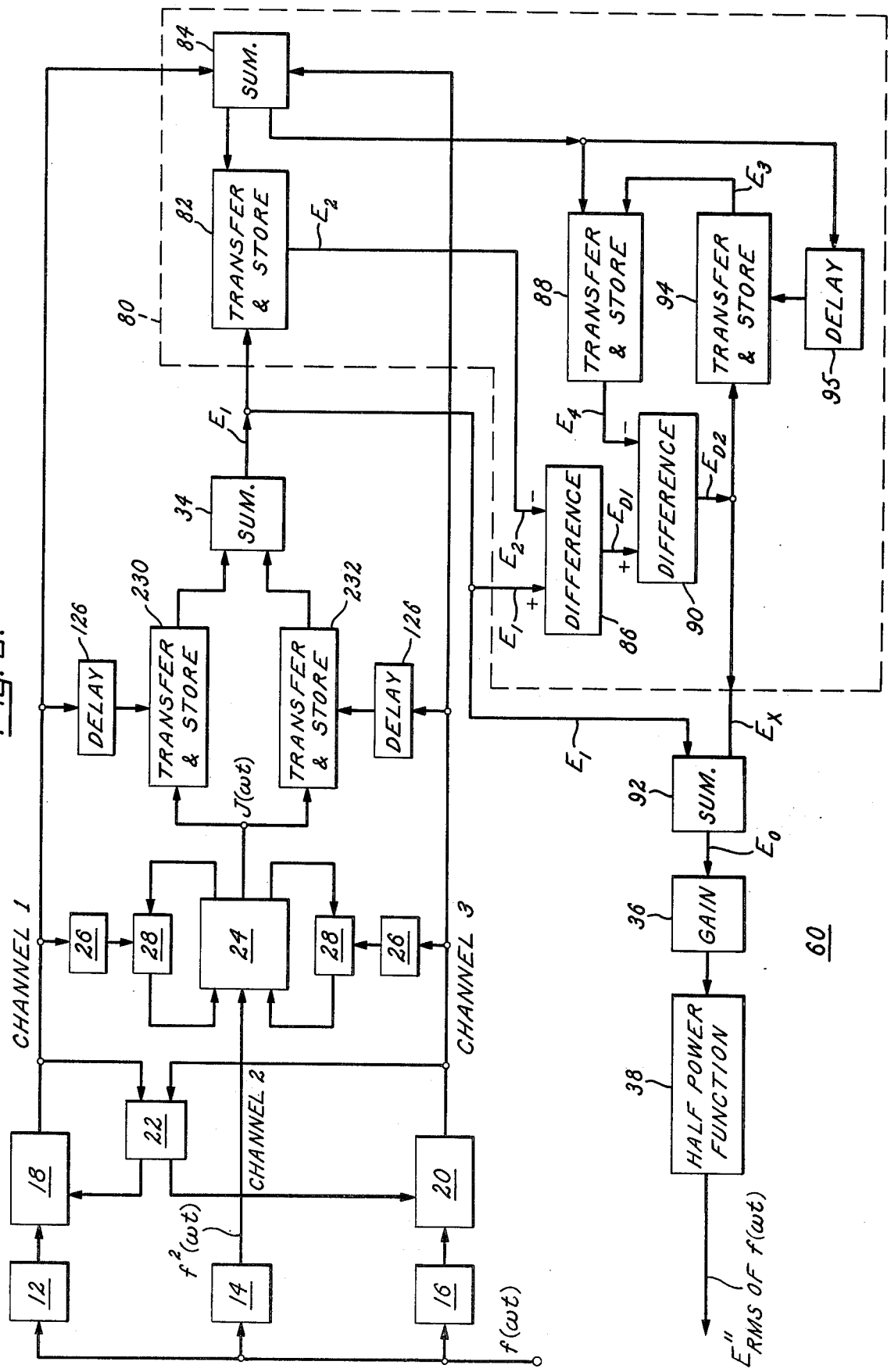
FIG. 5 is a block diagram of still another exemplary form of signal processing circuit suitable for use in the present invention.

Referring now to FIG. 5, a third exemplary signal processing circuit suitable for use in the present invention is generally designated 60. The signal processing circuit 60 is intended to combine, as much as is practicable, the most attractive features of the signal processing circuits 10 and 50 of FIGS. 1 and 4. That is, the signal processing circuit 60 is intended to provide the even and odd harmonics compatibility of the signal processing circuit 10 of FIG. 1 as well as the rapid one half cycle updating scheme of the signal processing circuit 50 of FIG. 4. Generally, this is accomplished by providing the signal processing circuit 10 of FIG. 1 with additional signal processing means for rapid updating of disturbances.

The signal processing circuit 60 of FIG. 5 is similar in many respects to the signal processing circuits 10 and 50 previously described, so that, where possible, like reference numerals have been employed to represent like elements.

The signal processing circuit 60 of FIG. 5 includes transfer and store components 230 and 232 which collectively store and transfer the integrated value of the $f^2(\omega t)$ waveform over the last complete cycle determined by consecutive zero crossings as in the signal processing circuit 10 of FIG. 1. More particularly, the transfer and store component 230 stores and transfers the integrated value of $f^2(\omega t)$ over the time period between consecutive negative to positive zero crossings while the transfer and store component 232 performs the same function over the following time period between consecutive positive to negative zero crossings. As in the signal processing circuit 10 of FIG. 1, the output signals of the transfer and store components 230 and 232 are summed by summation component 34, resulting in signal $E_1$ which is substantially the same as signal $E_1$ of FIG. 1. However, for reasons which will be later apparent, the pulse generators 18 and 20 are coupled to the transfer and store components 230 and 232 through additional delay components 126. Thus, the signal $E_1$ of the circuit 60 of FIG. 5 is slightly delayed, i.e., several microseconds, with respect to the signal $E_1$ of the circuit 10 of FIG. 1. The signal processing circuit 60 further provides disturbance signal processing means 80, shown in dashed lines, for generating an updating or correcting signal, hereinafter $E_x$. The correcting signal $E_x$ is then summed with the signal $E_1$ at summation component 92, resulting in a corrected signal $E_o$ which is more responsive to waveform disturbances than the uncorrected signal $E_1$. The corrected signal $E_o$ is then processed as discussed previously in connection with the signal $E_1$ of the signal processing circuit 10 of FIG. 1, resulting in an output signal $E''_{RMS}$.

The disturbance signal processing means 80 includes: three transfer and store components 82, 88, 94; a summation component 84; two difference components 86 and 90; and a delay component 95. The difference components 86 and 90 may comprise summation components with inverted inputs. It is to be noted that all of the elements in the signal processing means 80 are conventional. The manner of connection of the components in the signal processing means 80 is clearly shown in FIG. 5 and will be described more completely in connection with the operation thereof.

In order to appreciate the operation of the signal processing means 60 of FIG. 5, especially the additional disturbance signal processing means 80, reference will now be taken to FIGS. 6A-6M which depict signal waveforms associated therewith. As in the previous discussion in connection with FIG. 2A, the time varying waveform $f(\omega t)$ of FIG. 6A is shown, for purposes of illustration, as a rectangular waveform having a disturbance. Similarly, as shown in FIG. 6C, the integrated value between consecutive zero crossings of the $f(\omega t)$ waveform does not show the portion thereof lost due to the delay caused by delay components 26. As in the signal processing circuit 10 of FIG. 1, the transfer and store component 230 generates an output signal which is representative of the integrated value of $f^2(\omega t)$ over a time period between the last negative zero crossing and the following positive zero crossing, as shown in FIG. 6D. Similarly, the transfer and store component 232 generates an output signal representative of the integrated value of $f^2(\omega t)$ over the time period between the positive zero crossing and the following negative zero crossing, as shown in FIG. 6E. The output signal $E_1$ summation component 34, i.e., the sum of the outputs of transfer and store components 230 and 232 is shown in FIG. 6F. Note that, although slightly delayed, the $E_1$ signal is substantially identical to the $E_1$ signal of the signal processing circuit 10 of FIG. 1. In this connection, note also that the disturbance must continue through one complete cycle before its actual value is completely reflected in the $E_1$ signal. That is, as in the signal processing circuit 10 of FIG. 1, the integrated value of $f^2(\omega t)$ over the first one-half cycle of disturbance is summed with the integrated value of $f^2(\omega t)$ over the preceding undisturbed half cycle. Note also that FIGS. 6A-6F are substantially the same as FIGS. 2A-2F.

Referring now to the additional disturbance signal processing means 80, the transfer and store component 82 receives a branch of the $E_1$ signal as well as activating consecutive zero crossing signals from the output of the summation component 84. Thus, the transfer and store component 82 is operable at each consecutive zero crossing and passes the value of the $E_1$ signal which is shown in FIG. 6F. In this connection, note that the output signal, hereinafter $E_2$, of the transfer and store component 82 is shown in FIG. 6G and is substantially identical to signal $E_1$ of FIG. 6F. However, since the signal $E_1$ is slightly delayed (due to delay component 126), signal $E_2$ is delayed or shifted by the time interval between consecutive zero crossings. The output signal $E_{D1}$ of the difference component 86 is the difference between the $E_1$ signal and the half cycle delayed output signal $E_2$ of the transfer and store component 82, as shown in FIG. 6H. Note that, under steady state conditions (no disturbance), this difference will be zero and the signal processing means 80 will have zero input to the summation component 92. This means that, under these conditions, the output of the signal processing circuit 60 of FIG. 5 is substantially the same as the output of the circuit 10 of FIG. 1.

For purposes of illustration however, the difference signal $E_{D1}$ of FIG. 6H is shown having a finite value and duration. The difference signal $E_{D1}$ is directed into difference component 90 along with an intermediate signal comprising an output signal $E_4$ of the transfer and store component 88, resulting in a signal output $E_{D2}$ (shown in FIG. 6K) representative of the difference therebetween. More particularly, the transfer and store components 94 and 88 respectively provide signals $E_3$ (delayed) and $E_4$ (not delayed) which are shown in FIGS. 6I and 6J. The delay provided by the delay components 95 and 26 are substantially the same but greater than the delay provided by delay components 126 so that the non-delayed functions are completed first, followed by delayed functions provided by delay components 126, followed by delayed functions provided by delay components 26 and 95. Note that signal $E_4$ is the transferred and stored value of signal $E_3$ without delay so that the intermediate signal $E_4$ is delayed only by the time between consecutive zero crossings, i.e., one-half cycle. Note also that the signal $E_3$ is the difference between signals $E_{D1}$ and $E_4$ so that, under steady state conditions, $E_{D1} = E_{D2} = E_3 = E_4 = 0$.

The effect of the disturbance signal processing circuit means 80 is to provide the correction signal $E_{D2}$, hereinafter also termed $E_x$, which, when summed with the uncorrected signal $E_1$ by summation component 92, results in a corrected signal $E_o$. The corrected signal $E_o$ provides correction for the immediately preceding time interval between the last two zero crossings (half cycle). This effect can be observed by comparing the response of the uncorrected $E_1$ signal of FIG. 6F with the response of the corrected $E_o$ signal of FIG. 6L in the presence of the disturbance of FIG. 6A. Thus, the corrected $E_o$ signal of FIG. 6L is completely updated for the change in the integrated value of $f^2(\omega t)$ at the zero crossing immediately following the disturbance while the uncorrected signal $E_1$ of FIG. 6F is only partially updated at that time (after one half cycle of disturbance) but completely updated at the following zero crossing (after one cycle of disturbance). As previously discussed in connection with the signal processing circuit 10 of FIG. 1, the gain component 36 and half power function component 38 operate to generate a signal output $E''_{RMS}$ representative of the RMS of the corrected signal $E_o$ (see FIG. 6M). Thus, the signal output $E''_{RMS}$ of the signal processing circuit 60 of FIG. 5 is representative of the RMS value of the $f(\omega t)$ waveform over the last complete cycle thereof determined by its zero crossings. In addition, the signal $E''_{RMS}$ is completely updated after one half cycle following a disturbance. Further, it is to be appreciated that, as the signal processing circuit 60 preferably employs the basic signal processing circuit 10 of FIG. 1, odd and/or even harmonics present no problems.

In connection with the previously discussed signal processing circuits 10, 50 and 60, it is to be noted that the waveform(s) to be processed need not be a voltage waveform; it may be a current waveform. Also, if an exact RMS value of the waveform is desired, the appropriate gain compensation factor should be introduced into the processing, as is known in the art. However, since such gain compensation typically involves the introduction of a constant value or values, for many applications, their introduction may be omitted. Also, depending upon the magnitude of the $f(\omega t)$ waveform, a step down transformation may, or may not be appropriate.

In connection with the construction of the signal processing circuits hereinbefore discussed, well known techniques are available. The depicted processing can be readily implemented by integrated circuits and/or discrete devices. For additional information on suitable signal processing networks, see *OPERATIONAL AMPLIFIERS*, Design and Applications, Tobey-Graeme-Huelsman, McGraw-Hill Book Company, 1971, which is hereby incorporated by reference in the present application.

VOLTAGE REGULATING SYSTEM

Figure 8:
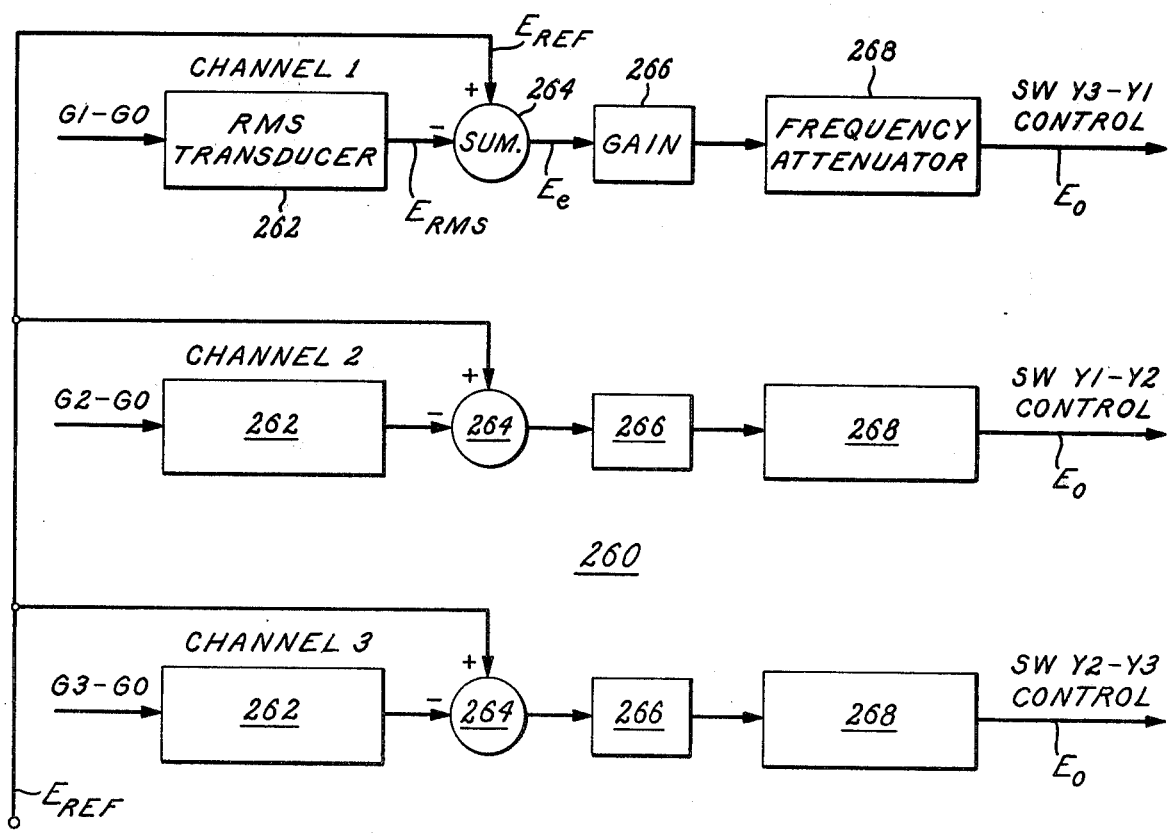
FIG. 8 is a highly simplified block diagram of one exemplary form of control circuit, employing transducer means of the present invention, suitable for use in the voltage regulating system of FIG. 7.

Referring now to FIGS. 7 and 8, one form of voltage regulating system for a three phase AC power system employing the RMS transducer of the present invention is partially shown in highly simplified block diagram form. More particularly, FIG. 7 depicts a typical reactive converter arrangement for regulating transmission line or bus voltage, and is generally designated 240. The voltage regulating system 240 includes reactive compensation means of the type disclosed in the previously mentioned Kelley and Kelley et al. U.S. Pat. Nos. 3,936,727 and 3,468,432, which have been incorporated by reference in the present application. FIG. 8 depicts one form of a control circuit, generally designated 260, in simplified block diagram form, employing the RMS transducer of the present invention, suitable for use in the voltage regulating system 240 of FIG. 7.

Referring now to FIG. 7, the voltage regulating system 240 includes transmission lines L1, L2 and L3 which may, for example, be at 115 kV line-to-line. A three phase transmission transformer 242 with separate arms H1, H2, H3 is shown connected to the transmission lines L1, L2 and L3. The purpose of the transmission transformer 242 is to provide means for connecting the reactive converter to the transmission line at a voltage level, e.g., 13.8 kV line-to-line, which is consistent with good economics. For the purpose of this description, numerals refer to the associated power transmission line.

A tertiary winding arrangement 244 with arms closed at Y1, Y2 and Y3 forms arms Y1-Y2, Y2-Y3, and Y3-Y1 which are coupled to the transformer 242 primary arms H1, H2, and H3. The tertiary arms function as the means to draw leading or lagging current (VARS) from the transmission transformer primary arms, and hence the respective transmission lines L1, L2, and L3.

For the efficient use of conventionally available static switching elements, the tertiary transformer 244 is shown as exhibiting 13.8 kV line-to-line. A reactive converter 246 includes fixed capacitors 248 (inductors 250 are shown for tuning purposes only) for drawing leading current or vars. Fixed inductors 252 for drawing lagging current or vars are provided in series circuit relation with static switching means 254 across each transformer tertiary winding section. The static switching means 254 include gating control means 256 for controlling the conduction angle of the switching means 254 so as to control the magnitude of reactive current traversing the inductors 252. The gating control means 256 may comprise control means such as those described in U.S. Pat. No. 3,936,726 issued Feb. 3, 1976 to F. W. Kelley, Jr. and assigned to the assignee of the present invention. This patent is hereby incorporated by reference in the present application.

The primary windings (arms H1, H2, H3) of a potential transformer arrangement 258 is connected to transmission lines L1, L2, L3 at a point in the power system at which good voltage regulation is desired. The secondary of the potential transformer 258 produces secondary voltages G1, G2, G3, which are about 115 volts line to neutral ($G_o$). The neutral ($G_o$) is usually grounded for protective purposes.

Referring now to FIG. 8, the control circuit 260 includes one form of RMS transducer 262 of the present invention. In the present regulating system embodiment, each phase is independently controlled by its own channel. For example, referring to channel 1, the transducer 262 receives the stepped down voltage of the L1 voltage waveform and generates an output signal $E_{RMS}$ which is representative of the RMS value thereof. The output signal $E_{RMS}$ is directed to a summation component 264 where it is inverted. An adjustable reference signal, hereinafter $E_{REF}$, is directed to the other input of the summation component 264. The reference signal $E_{REF}$ is chosen to be representative of the RMS value at the desired voltage regulation level. As shown in FIG. 8, the polarities at the summation component 264 are chosen such that the reference signal $E_{REF}$, if greater than the RMS signal $E_{RMS}$, causes the switch conduction angle to decrease, thus increasing the line voltage L1. More particularly, the summation component 264 generates an error signal $E_e$ which is amplified by the gain component 266. A frequency attenuator 268 is provided in order to ensure stable and responsive operation. The frequency attenuator 268 adjusts the frequency transfer characteristics around the closed regulating loop as is well known in the art. The output signal $E_o$ of channel 1 is then directed to the gating angle control means 256 associated with Y3–Y1 of the tertiary transformer 244 of FIG. 7. The output signals of the other channels 2 and 3 and the connections to the gating angle control means 256 of FIG. 7 are similar and clearly shown.

In the operation of the voltage regulating system shown in FIGS. 7 and 8, the total controllable leading or lagging currents or VARs drawn by the switchable inductors 252 and the non-switchable capacitors 248 are reflected in the tertiary transformer windings 244 which are coupled to the transmission transformer primary windings 242. Thus, as a result of this coupling, the transmission transformer 242 also draws the controllable VARs from the respective transmission lines L1, L2 and L3.

For example, increased conduction of switch Y3–Y1 causes a change in the VARs associated with transmission line L1 that is lagging. This change will act through a typically inductive AC power system causing a decrease in the L1 voltage. Similarly, decreased conduction of switch Y3–Y1 will cause an increase in the L1 voltage. As previously mentioned, both the reactive converter 246 of FIG. 7 and the transducer 262 of FIG. 8 are rapidly responsive so that the voltage regulation system shown in combination in FIGS. 7 and 8 allows rapid voltage regulation.

Although the voltage regulating system of the present invention has been described in connection with separate control of each phase of a three phase AC power system, the voltage regulating system is also applicable for regulating a single phase or other plural phase power system. Further, if desired, the voltage regulating system may employ a single transducer. In such a case, the RMS value at the critical point in the power system at which good voltage regulation is desired would be the point associated with a single phase of the system. Such a technique would then compare the RMS value with the reference value and provide substantially equal reactive compensation, i.e., leading or lagging VARs, to all the phases present. It is to be appreciated, however, that such a technique might be undesirable for those polyphase situations in which unbalanced loads are anticipated.

Also, although the voltage regulating system hereinbefore described preferably employs a square root function for obtaining a true RMS value, for some applications, the square root function may be omitted. For such applications, the square of the RMS value would be employed.

While I have illustrated preferred embodiments of my invention, many modifications will occur to those skilled in the art and I therefore wish to have it understood that I intend in the appended claims to cover all such modifications as fall within the true spirit and scope of my invention.

What I claim as new and desire to secure by Letters Patent of the United States is:

1. Apparatus for generating an electrical signal representative of the RMS value of a time varying waveform of the form $f(\omega t)$, which comprises:
   (a) first signal processing means for generating a first electrical output signal representative of the squared value of said $f(\omega t)$ waveform;
   (b) second signal processing means for generating second electrical output signals at zero crossings of said $f(\omega t)$ waveform;
   (c) third signal processing means for integrating said first electrical signal over time periods defined by said second electrical output signals and generating a third output signal therefrom, said third output signal being representative of the integrated squared value of said $f(\omega t)$ waveform over one of said time periods and reset means operable at zero crossings of said $f(\omega t)$ waveform for resetting said third signal processing means to start said third signal processing means on a new integrating operation;
   (d) fourth signal processing means for receiving said third output signal and developing a substantially continuous fourth output signal representative of the value of said third output signal at said zero crossings and update means operable at said zero crossings for updating said fourth output signal; and
   (e) fifth signal processing means for receiving said fourth output signal of said fourth signal processing means and generating a fifth output signal therefrom representative of the square root thereof.

2. Apparatus in accordance with claim 1 in which said second signal processing means includes temporary inhibit means for preventing the development of said second output signal for a predetermined time period after a first zero crossing.

3. Apparatus in accordance with claim 1 in which said reset means is operable at said zero crossings in response to said second output signals.

4. Apparatus in accordance with claim 3 in which said update means is operable at said zero crossings in response to said second output signals.

5. Apparatus in accordance with claim 4 in which said second signal processing means comprises means for generating electrical signals at substantially consecutive positive and negative zero crossings of said time varying waveform.

6. Apparatus in accordance with claim 5 in which said second signal processing means comprises at least two zero cross detectors and at least one pulse generator connected thereto for providing a zero crossing pulse when activated by one of said zero cross detectors.

7. Apparatus in accordance with claim 6 in which said second signal processing means further comprises temporary inhibit signal processing means for preventing the development of said second output signal for a predetermined time period after a first zero crossing, said temporary inhibit signal processing means coupled to said pulse generator.

8. Apparatus in accordance with claim 7 in which said fourth signal processing means comprises at least one transfer and store component.

9. Apparatus in accordance with claim 8 in which said reset means includes delay means coupled to said second output signal of said second signal processing means for ensuring storage in said transfer and store component.

10. Apparatus in accordance with claim 5 in which said fourth signal processing means comprises:
(a) two transfer and store components, one of said transfer and store components receiving said third output signal of said third signal processing means which is representative of the integrated squared value of $f(\omega t)$ over the time period between a positive to negative zero crossing and the other transfer and store component receiving said third output signal of said third signal processing means which is representative of the integrated squared value of $f(\omega t)$ over the following negative to positive zero crossing, said one component transferring and storing said integrated squared value at said negative zero crossing and the other transfer and store component transferring and storing said integrated squared value at said positive zero crossing; and
(b) first summation means for receiving the outputs of said two transfer and store components and generating an output signal therefrom representative of the sum thereof.

11. Apparatus in accordance with claim 10 which includes a positive zero crossing channel and a negative zero crossing channel, each of said zero crossing channels including a zero cross detector and a pulse generator, said pulse generators and said respective channels being cross coupled through temporary inhibit means.

12. Apparatus in accordance with claim 11 in which the output signal of said first summation means is connected to said fifth signal processing means through gain compensating means.

13. Apparatus in accordance with claim 10 which includes disturbance signal processing means for rapidly sensing a disturbance in said waveform and generating a correcting signal and second summation means for summing said correcting signal with said output signal of said first summation means.

14. Apparatus in accordance with claim 13 in which said fourth signal processing means includes delay means coupled to said update means for delaying said output signal of said first summation means.

15. Apparatus in accordance with claim 14 in which said disturbance signal processing means comprises:
(a) first disturbance means for receiving said output signal of said first summation means and generating a first disturbance output signal substantially identical to said output signal of said first summation means but delayed about one half cycle;
(b) second disturbance means for receiving said output signals of a) and said first summation means and generating a second disturbance output signal representative of the difference therebetween; and
(c) third disturbance means for receiving said second disturbance output signal of (b) and an intermediate signal and generating a fourth disturbance output signal representative of the difference therebetween, said fourth disturbance output signal comprising said correcting signal, said intermediate signal comprising a signal which is substantially identical to said fourth disturbance output signal but delayed about one half cycle.

16. Apparatus in accordance with claim 15 in which said first disturbance means comprises a third transfer and store component and a third summation component, said third transfer and store component receiving the output signal of said first summation means and an actuating signal from said third summation component, said third summation component receiving the second output signals of said second signal processing means.

17. Apparatus in accordance with claim 16 in which said second disturbance means comprises a first difference component and in which said third disturbance means comprises a second difference component and fourth and fifth transfer and store components, the output of said second difference component being directed to said fourth transfer and store component which is actuated through delay means by the output of said third summation component, said fifth transfer and store component coupled to receive the output of said fourth transfer and store component and being actuated by the output of said third summation component, said second difference component receiving the outputs of said first difference component and said fifth transfer and store component.

18. Voltage regulating system for an AC electrical power system, which comprises:
(a) a reactive converter which includes:
(1) fixed capacitor means,
(2) fixed inductor means,
(3) static switching means in series circuit relation with said fixed inductor means, said static switching means including gating means for controlling the conduction angle of said switching means so as to control the magnitude of reactive current traversing said inductor means;
(b) first means for providing a reference electrical output signal representative of a desired voltage level;
(c) second means for providing an electrical output signal representative of the RMS value of the voltage waveform at a critical point in said AC power system at which good voltage regulation is desired, said second means including:
(1) first signal processing means for generating a first electrical output signal representative of the squared value of said voltage waveform;
(2) second signal processing means for generating second electrical output signals at zero crossings of said voltage waveform;
(3) third signal processing means for integrating said first electrical signal over time periods defined by said second electrical output signals and generating a third output signal therefrom, said third output signal being representative of the integrated squared value of said waveform over one of said time periods and reset means operable at zero crossings of said waveform for resetting said third signal processing means to start said third signal processing means on a new integrating operation;
(4) fourth signal processing means for receiving said third output signal and developing a substantially continuous fourth output signal representative of the value of said third output signal at said zero crossings and update means operable at said zero crossings for updating said fourth output signal; and (d) third means for comparing said electrical signals of said first and second means and generating an output signal therefrom which is directed to said gating means of said static switching means so as to control said conduction angle of said switching means.

19. System in accordance with claim 18 in which said output signal of said third means is representative of the difference between said electrical signals of said first and second means.

20. System in accordance with claim 18 in which said second signal processing means includes temporary inhibit means for preventing the development of said second output signal for a predetermined time period after a first zero crossing.

21. System in accordance with claim 18 in which said reset means is operable at said zero crossings in response to said second output signals.

22. System in accordance with claim 21 in which said update means is operable at said zero crossings in response to said second output signals.

23. System in accordance with claim 22 in which said second signal processing means comprises means for generating electrical signals at substantially consecutive positive and negative zero crossings of said voltage waveform.

24. System in accordance with claim 23 in which said second signal processing means comprises at least two zero cross detectors and at least one pulse generator connected thereto for providing a zero crossing pulse when activated by one of said zero cross detectors.

25. System in accordance with claim 24 in which said second signal processing means further comprises temporary inhibit signal processing means for preventing the development of said second output signal for a predetermined time period after a first zero crossing, said temporary inhibit signal processing means coupled to said pulse generator.

26. System in accordance with claim 25 in which said fourth signal processing means comprises at least one transfer and store component.

27. System in accordance with claim 26 in which said reset means includes delay means coupled to said second output signal of said second signal processing means for ensuring storage in said transfer and store component.

28. System in accordance with claim 23 in which said fourth signal processing means comprises:

(a) two transfer and store components, one of said transfer and store components receiving said third output signal of said third signal processing means which is representative of the integrated squared value of the voltage waveform over the time period between a positive to negative zero crossing and the other transfer and store component receiving said third output signal of said third signal processing means which is representative of the integrated squared value of the voltage waveform over the following negative to positive zero crossing, said one component transferring and storing said integrated squared value at said negative zero crossing and the other transfer and store component transferring and storing said integrated squared value at said positive zero crossing; and (b) first summation means for receiving the outputs of said two transfer and store components and generating an output signal therefrom representative of the sum thereof.

29. System in accordance with claim 28 which includes a positive zero crossing channel and a negative zero crossing channel, each of said zero crossing channels including a zero cross detector and a pulse generator, said pulse generators and said respective channels being cross coupled through temporary inhibit means.

30. System in accordance with claim 29 in which the output signal of said first summation means is connected to fifth signal processing means, said fifth signal processing means comprising means for receiving the output of said first summation means and generating a fifth output signal representative of the square root thereof.

31. System in accordance with claim 28 which includes disturbance signal processing means for rapidly sensing a disturbance in said waveform and generating a correcting signal and second summation means for summing said correcting signal with said output signal of said first summation means.

32. System in accordance with claim 31 in which said fourth signal processing means includes delay means coupled to said update means for delaying said output signal of said first summation means.

33. System in accordance with claim 32 in which said disturbance signal processing means comprises:

(a) first disturbance means for receiving said output signal of said first summation means and generating a first disturbance output signal substantially identical to said output signal of said first summation means but delayed about one half cycle;

(b) second disturbance means for receiving said output signals of (a) and said first summation means and generating a second disturbance output signal representative of the difference therebetween; and (c) third disturbance means for receiving said second disturbance output signal of (b) and an intermediate signal and generating a fourth disturbance signal representative of the difference therebetween, said fourth disturbance output signal comprising said correcting signal, said intermediate signal comprising a signal which is substantially identical to said fourth disturbance output signal but delayed about one half cycle.

34. System in accordance with claim 33 in which said first disturbance means comprises a third transfer and store component and a third summation component, said third transfer and store component receiving the output signal of said first summation means and an actuating signal from said third summation component, said third summation component receiving the second output signals of said second signal processing means.

35. System in accordance with claim 16 in which said second disturbance means comprises a first difference component and in which said third disturbance means comprises a second difference component and fourth and fifth transfer and store components, the output of said second difference component being directed to said fourth transfer and store component which is actuated through delay means by the output of said third summation component, said fifth transfer and store component coupled to receive the output of said fourth transfer and store component and being actuated by the output of said third summation component, said second difference component receiving the outputs of said first difference component and said fifth transfer and store component.

* * * * *